(12) United States Patent  (10) Patent No.: US 7,601,602 B2
Aitken et al.  (45) Date of Patent: Oct. 13, 2009

(54) TRENCH TYPE BURIED ON-CHIP PRECISION PROGRAMMABLE RESISTOR

(75) Inventors: John M. Aitken, South Burlington, VT (US); Fen Chen, Williston, VT (US); Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 515 days.

(21) Appl. No.: 11/481,514

(22) Filed: Jul. 6, 2006

(65) Prior Publication Data
US 2006/0267144 A1 Nov. 30, 2006

Related U.S. Application Data

(62) Division of application No. 10/709,727, filed on May 25, 2004, now Pat. No. 7,084,483.

(51) Int. Cl.
*H01L 21/04* (2006.01)
(52) U.S. Cl. .............. 438/382; 257/E21.004; 257/E25.016; 257/E25.026; 257/E29.326; 257/E27.047
(58) Field of Classification Search .......... 438/382, 438/430; 257/508, 516, 520, 536, 538, E21.004, 257/E25.016, E25.026, E29.326, E27.047
See application file for complete search history.

(56) References Cited

U.S. PATENT DOCUMENTS

| 3,619,739 | A | | 11/1971 | Camenzind et al. |
| 4,323,913 | A | * | 4/1982 | Murrmann et al. .......... 257/577 |
| 4,868,482 | A | | 9/1989 | O'Shaughnessy et al. |
| 4,933,739 | A | * | 6/1990 | Harari ........................ 257/621 |
| 4,962,365 | A | * | 10/1990 | Havemann et al. .......... 338/306 |
| 5,134,088 | A | | 7/1992 | Zetterlung |
| 5,316,978 | A | * | 5/1994 | Boyd et al. ................... 438/382 |
| 5,352,923 | A | | 10/1994 | Boyd et al. |
| 5,905,279 | A | * | 5/1999 | Nitayama et al. ........... 257/301 |
| 6,504,417 | B1 | | 1/2003 | Cecchi et al. |
| 6,528,383 | B1 | * | 3/2003 | Chakravarti et al. ......... 438/381 |
| 6,566,226 | B2 | | 5/2003 | Hatanaka |
| 6,605,958 | B2 | | 8/2003 | Bergman et al. |
| 7,375,000 | B2 | * | 5/2008 | Nowak et al. ................ 438/382 |
| 2001/0022384 | A1 | | 9/2001 | Leonardi et al. |
| 2003/0089597 | A1 | | 5/2003 | Tang et al. |
| 2003/0157778 | A1 | | 8/2003 | Hemmenway et al. |
| 2003/0213998 | A1 | | 11/2003 | Hsu et al. |
| 2007/0158725 | A1 | * | 7/2007 | Cheng et al. ................. 257/301 |

FOREIGN PATENT DOCUMENTS

JP 11-330412 * 11/1999

* cited by examiner

*Primary Examiner*—M. Wilczewski
(74) *Attorney, Agent, or Firm*—Scully, Scott, Murphy & Presser, P.C.; Riyon Harding

(57) ABSTRACT

An on-chip, ultra-compact, and programmable semiconductor resistor device and device structure and a method of fabrication. Each semiconductor resistor device structure is formed of one or more conductively connected buried trench type resistor elements exhibiting a precise resistor value. At least two semiconductor resistor device structures may be connected in series or in parallel configuration through the intermediary of one or more fuse devices that may be blown to achieve a desired total resistance value.

2 Claims, 4 Drawing Sheets

TaN WET ETCH

TRENCH TYPE BURIED ON-CHIP PRECISION PROGRAMMABLE RESISTOR

RELATED APPLICATIONS

This application is a divisional of U.S. application Ser. No. 10/709,727, filed May 25, 2004 now U.S. Pat. No. 7,084,483.

BACKGROUND OF THE INVENTION

1. Field of the Invention

The present invention relates generally to electronic devices and specifically, is directed to the manufacture of compact, precision semiconductor on-chip resistors and precision resistor array devices having improved properties.

2. Description of the Prior Art

Conventional on-chip resistors made of TaN or polysilicon are either placed within the multi-level Back End of Line (BEOL) interconnect layers or placed on the surface of a Si substrate. For TaN precision on-chip resistors which are placed within the metal levels, heat dissipation, thermally induced electromigration (EM) of neighboring interconnect wires, and the space occupancy are all of some concern. For polysilicon resistors which are placed on the surface of the Si substrate, precision control of resistance (control of doping level), doping uniformity, resistance variation due to temperature, and space occupancy are also of serious concerns. Therefore, there is a need to develop a compact precision resistor configuration with good thermal dissipation and less EM impacts on BEOL interconnects.

It would be highly desirable to provide a new on-chip, ultra-compact, and programmable resistor configuration and a method of forming such on-chip, ultra-compact, and programmable resistors, e.g., in CMOS technology.

SUMMARY OF THE INVENTION

According to the invention, there is provided an on-chip, ultra-compact, and programmable resistor device structure and a method of fabricating such programmable resistor structure.

In a first embodiment of the invention there is provided a semiconductor resistor device structure and method of manufacture. According to this first embodiment, a semiconductor resistor device element comprises a single trench buried in a semiconductor substrate, the trench filled with a conductive material, e.g., TaN or PolySilicon material, and lined with an insulator material.

Further to the first embodiment, there is provided a semiconductor resistor device and method of manufacture, wherein a conductive material, e.g., TaN or PolySilicon material, is buried inside each trench of a series of trenches that are connected in a unique way to form a resistor sub-array on a substrate, the array having a precise resistor value. A thin dielectric material is formed between the TaN or PolySilicon material and the substrate to serve as an insulation layer. Resistor sub-arrays may be connected through a fuse either in series or in parallel to form a programmable precision resistor array.

According to a second embodiment, a semiconductor resistor device element comprises a single trench buried in a semiconductor substrate, the trench including a dielectric material lining each side and bottom of the trench, and including a conductive material layer formed within the trench having a bottom and two side portions of the trench, the trench further filled with a dielectric material.

Further to the second embodiment of the invention, there is provided a semiconductor resistor device structure and method of manufacture, wherein a conductive film of TaN or PolySilicon material, for example, is formed buried inside each trench of a series of trenches that are connected to form a resistor sub-array on a substrate having a precise resistor value. A thin dielectric material is formed between the TaN or PolySilicon conductive film and the substrate to serve as an insulation layer.

Resistor sub-arrays according to the first and second embodiments may be connected through a fuse either in series or in parallel to form a programmable precision resistor array.

In each of the first and second embodiments, each column and row of the resistor array is separated by isolation (such as trench isolation or STI) or local oxidation of silicon (LOCOS) to minimize noise. The whole substrate serves as a good heat sink for thermal dissipation. The whole resistor structure is ultra-compact, taking up a small surface area of space. Further, utilizing the trench array concept of the invention, blocks of arrays may be connected through fuses that may be blown to form a resultant resistor structure of a very precise resistance value.

Advantageously, the process methods implemented in the production of the precision resistors and resistor arrays of the invention are fully compatible with current CMOS processes and only very limited extra steps are required to fabricate such resistors.

BRIEF DESCRIPTION OF THE DRAWINGS

The objects, features and advantages of the present invention will become apparent to one skilled in the art, in view of the following detailed description taken in combination with the attached drawings in which.

DETAILED DESCRIPTION OF THE PREFERRED EMBODIMENTS

Figure 1:
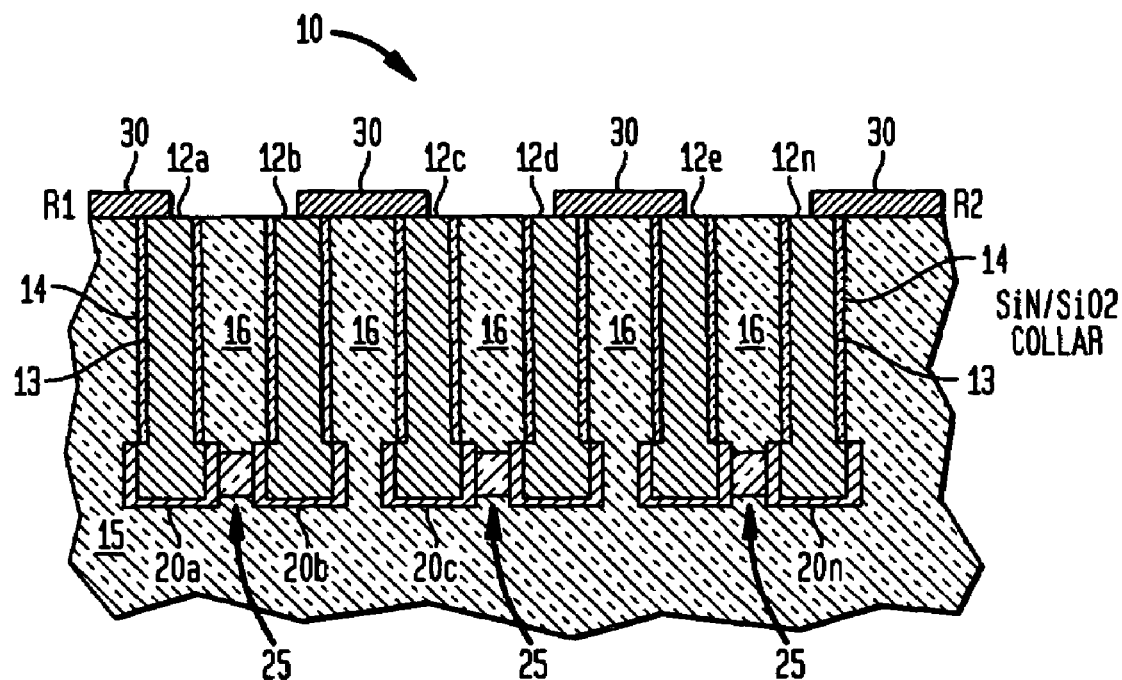
FIG. 1 illustrates a cross-sectional view of a trench type buried resistor according to a first embodiment of the invention.

FIG. 1 illustrates a cross-sectional view of a trench type buried resistor 10 according to a first embodiment of the invention. As shown in FIG. 1, the trench buried type resistor includes a series of trenches 12a, 12b, . . . , 12n formed in a substrate 15, aligned, for example, in a row, with each trench separated by a dielectric region 16, e.g., an oxide. Each trench 12a, 12b, . . . , 12n is filled with a conductor material 13 such as Tantalum Nitride (TaN) or Polysilicon, and each trench includes a buried plate bottom connective portion 20a, 20b, . . . , 20n. As shown in FIG. 1, between alternating adjacent first trenches, e.g., trenches 12a, 12b and 12c, 12d, etc., there are formed ion implantation bands 25 comprising ion implanted doped substrate material that connect these adjacent trenches in alternating fashion. Likewise, between alternating adjacent second trenches 12b, 12c and 12d, 12e etc., there are formed top surface resistive connective portions 30 that connect these adjacent trenches in alternating fashion as shown in FIG. 1. The resultant structure of device 10 shown in FIG. 1 is a series of connected individual buried trench type resistor elements that form a buried trench type resistor chain having a resistor value. As will be described, each individual connected resistor portion has a resistive value (in ohms) that varies according to the dimensions of the trench and the type of conductive material used to fill the trench. It is understood that the formed chain comprising the plurality of connected trench resistor portions may be tailored to form a resistor device structure 10 according to a desired resistive value. More particularly, as shown in FIG. 1, each trench 12a, 12b, ..., 12n includes a bottom portion comprising a buried plate contact 20 formed of a conductive material, and includes sidewalls in an upper portion lined with a dielectric material, e.g., an oxide, nitride or oxynitride to form a collar 14. Examples of dielectric materials forming a trench collar include SiN, $SiO_2$ or like dielectric material. As will be explained in greater detail herein, after forming the trenches with each bottom plate connector 20, and after forming the alternative top surface connection portions, the doped ion implantation bands 25 that connect alternating adjacent first trenches, e.g., trenches 12a, 12b and 12c, 12d, etc., are formed by ion implantation techniques that connect every other trench implementing a self-aligned method. For a particular resistor design, n+ dopants may be ion implanted.

A method for forming the trench type buried resistor 10 according to the first embodiment of the invention includes the following process steps: First, a reactive ion etch (RIE) technique is implemented for forming a series of trenches 12a, 12b, ..., 12n in a substrate such as Silicon, SiGe, GaAs, etc. Each trench may range in depth between about 1.0 μm to 7.0 μm below the substrate surface, for example, and may be of a width and a length ranging between 0.1 μm and 10 μm commensurate with current CMOS fabrication techniques. The shape of the top trench surface could be oval, rectanglar, circular, square, etc. The distance between adjacent trenches may further range between 0.1 μm and 10 μm. Each trench in the series is separated by an isolation 16 (such as a shallow trench isolation or STI) or local oxidation of silicon (LOCOS) to minimize noise as shown in FIG. 1. After the formation of the trenches and isolation regions, an Arsenic silicon glass (ASG) or gas phase doping (GPD) process is implemented to form trench bottom buried plate contacts 20a, ..., 20n in accordance with well-known processes. In one embodiment, the buried plate contact is 800 Å thick arsenic doped Silicon glass. Then, a dielectric collar 14 is formed at sidewalls of a portion of each trench above the buried plate contact and comprises an oxide, SiN, $SiO_2$, or other low-k or high-k dielectric material. A conventional process may be used to form the dielectric collar to line the inner sidewalls of the upper portions of each trench. After lining each trench sidewall with a dielectric collar, a deposition, e.g., chemical vapor deposition (CVD) or like deposition technique, e.g., PVD, MBE, thermal evaporation, e-beam, etc., may be used to fill the trench with conductive materials including, TaN, Polysilicon material, or other conductive material such as Ta, W, Ti, Cu, Al, TiN, TaN/TiN bilayer, Pt, alloys of pure metals, etc. The TaN or Polysilicon trench fill material is then subject to a chemical-mechanical polish (CMP) technique for planarizing the top trench surface portions. Then, implementing a mask and conventional deposition techniques, TaN, Polysilicon, or like conductive material used to form the resistor is deposited at the surface locations to form the top surface connections 30 between alternating second adjacent trenches such as shown in FIG. 1. Finally, the self-aligned trench bottom buried plate ion implantation band connections 25 that connect alternating adjacent first trenches such as shown in FIG. 1, are formed by known ion implantation techniques. Known ion implantation techniques may be utilized that are tailored according to the type of dopant utilized which may comprise n+ dopant material such as arsenic, phosphorus or, p+ dopant material such as boron. In one embodiment, the connective ion implantation band is about 0.25 μm above the trench bottom. As known, the depth of connective ion implantation band determines the ion implantation energies. As an example, for 1.75 um deep phosphorus doped connective band with doping concentration equal to $1.0e18\ cm^{-3}$, the ion implantation parameters are: 1000 keV energy and $4.0e13\ cm^2$ dose.

According to the first embodiment of the buried trench resistor, when either TaN or polySi is used to fill all the trench, the approximate resistance value per trench, $R_{(Trench)}$, is calculated according to equation 1) as:

$$R_{(Trench)} = \rho_{(TaN\ or\ polySi)} * h/A \qquad 1)$$

For both TaN and polySi fill cases, the rho (ρ) could be varied. For example, assuming a typical $\rho_{(TaN)}$=3.0 ohm-μm and a trench dimension h=2.0 μm, D (diameter)=0.5, and $A=pi*D^2/4$ for a cylinder type trench (top trench surface is a circle), the $R_{(TaN)}$ is approximately 30.56 ohm (ω). A typical $\rho_{(polySi)}$=9.0 ohm-μm to 15.0 ohm-μm.

Figure 2:
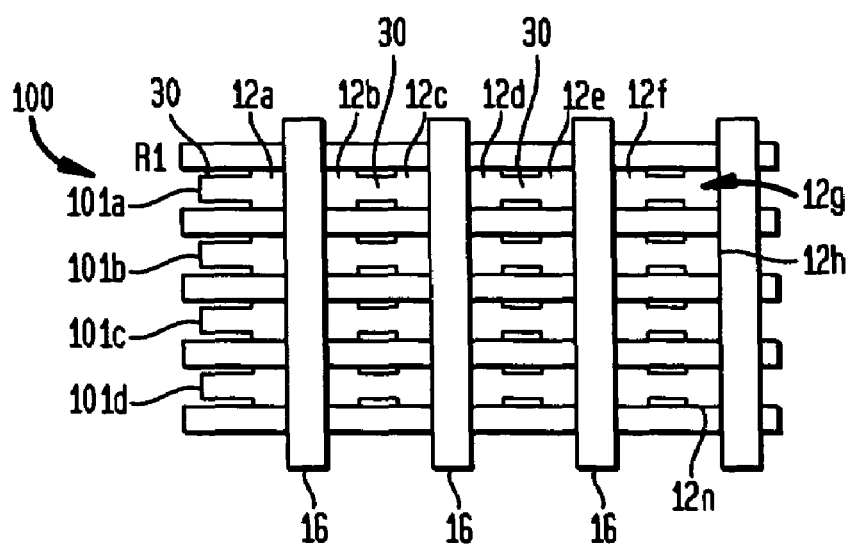
FIG. 2 illustrates a top view of a trench type buried resistor array having resistive elements formed in accordance with the embodiment depicted in FIG. 1.

FIG. 2 illustrates a top view of an example trench type buried resistor array 100 including resistors formed according to the embodiment depicted in FIG. 1. In the array 100 of FIG. 2, multiple rows, e.g., four (4) rows 101a, ..., 101d, each comprise a chain of trench type resistor elements, e.g., seven (7) trenches 12a-12g in row 101a, are formed according to the method herein described. Bottom plate elements (not shown) of resistive trenches 12g and 12h, for instance, may be connected to form a series connection, so that the whole array 100 comprises a chain connection of resistive elements. Other configurations are possible with chains of buried trench resistor elements of the array connected in parallel. As will be described in greater detail herein, by connecting fuse devices at specific locations in the trench type buried resistor array of FIG. 2, or between connected trench type buried resistor arrays, and judiciously destroying one or more fuses, a resistor having a precise value may be programmed.

Figure 3:
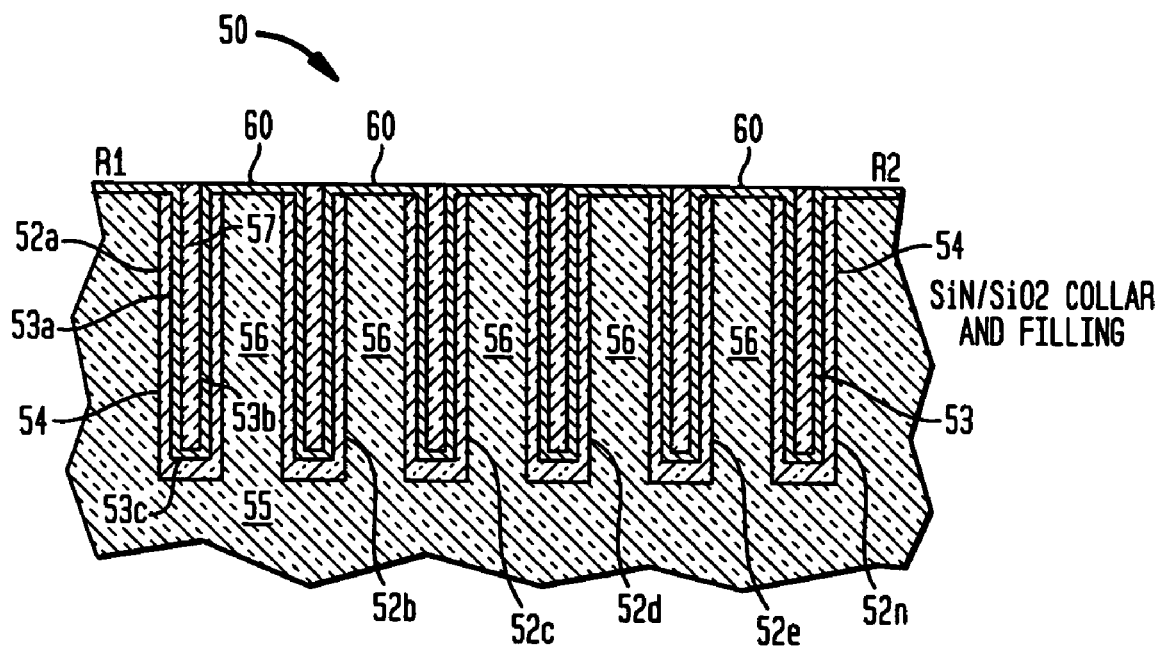
FIG. 3 illustrates a cross-sectional view of a trench type buried resistor according to a second embodiment of the invention.

FIG. 3 illustrates a cross-sectional view of a trench type buried resistor 50 according to a second embodiment of the invention. As shown in FIG. 3, the trench buried type resistor includes a series of trenches 52a, 52b, ..., 52n formed in a substrate 55, aligned, for example, in a row, with each trench separated by a dielectric region 56, e.g., an oxide. Each trench 52a, 52b, ..., 52n includes a buried thin layer 53 of conductive material such as TaN or Polysilicon, shaped in conformance with the shape of the trench and having side 53a,b and bottom 53c portions. This thin conductive material layer may range between 50 Å and 500 Å in thickness depending upon the desired resistance, e.g., as dictated by circuit requirements. Between each trench 52a, 52b, ..., 52n there is formed a top surface resistive connector portion 60 that connects each buried thin layer 53 (conductive layer sidewalls 53a,b) of a trench with the buried thin conductive layer 53 of an adjacent trench, thus forming a series connection of individual connected resistor portions that form a resistor chain. The resultant structure of device 50 shown in FIG. 3 is a series connection of individual connected buried trench type resistors that form a buried trench type resistor chain having a resistor value. As will be described, each individual connected resistor portion has a resistive value (in ohms) that varies according to the dimensions of the trench and the thickness and type of conductive buried thin layer 53 within the trench. Each individual connected resistor portion has a determined resistive value and a formed chain of a plurality of connected trench resistor portions may be tailored to form a resistor device structure 50 according to a desired resistive value. More particularly, each trench 52a, 52b, . . . , 52n includes a dielectric material 54 formed at the bottom and on the sidewalls to surround the bottom and side portions of the thin conductive material layer 53, the rest of the trench including a dielectric material filler such as an oxide, nitride or oxynitride. Example dielectric materials include SiN, $SiO_2$ or like dielectric material.

A method for forming the trench type buried resistor 50 according to the second embodiment of the invention includes the following process steps: First, a reactive ion etch (RIE) technique is implemented for forming a series of trenches 52a, 52b, . . . , 52n in a substrate 55 such as Silicon, SiGe, GaAs, etc. Use of a substrate etch process that purposely tapers the trench sidewall can be useful both for removing the TaN by RIE, and to allow some kinds of PVD processes to deposit the TaN or other conductive films. Each trench may range in depth from 1.0 μm to 7.0 μm below the substrate surface, and may be of a width and a length between 0.1 μm and 10 μm commensurate with current CMOS fabrication techniques. The distance between adjacent trenches ranges between 0.1 μm and 10 μm. After the formation of the trenches, the dielectric collar 54 comprising, for instance, an oxide, SiN, $SiO_2$, or other low-k or high-k dielectric material is formed at sidewalls and bottom portion of each trench. A conventional process, e.g., thermal oxidation, may be used to form the dielectric collar 54 that lines the inner sidewalls of the upper portions of each trench. After lining each trench sidewall and trench bottom with the dielectric, a deposition, e.g., chemical vapor deposition (CVD) or like deposition technique is used to form the buried thin layer 53 of conductive material such as TaN, Polysilicon material, or other conductive material inside the trench that conforms to the structure of the formed collar at the bottom, front, back and sidewalls. However, as will be described in greater detail, the front and back portions of the buried thin layer 53 are removed in a later process step. Next, a further step is performed to fill the trench with a dielectric material 57 such as an oxide, SiN, $SiO_2$, or other low-k or high-k dielectric material.

Figure 5A:
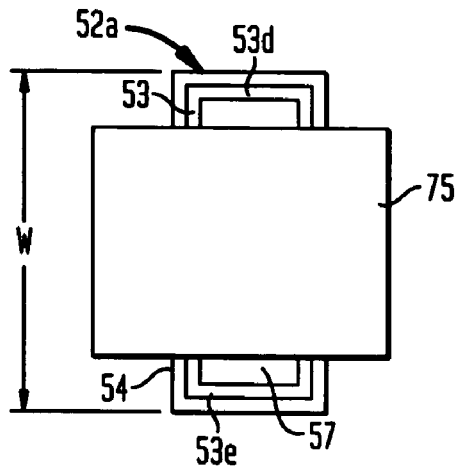
FIGS. 5(a)-5(d) illustrate various process steps implemented in the formation of the deep trench buried resistor of FIG. 3; and, FIG. 6 illustrates a programmable trench resistor comprising sub-banks of buried trench type resistors according to the invention.
Figure 5B:
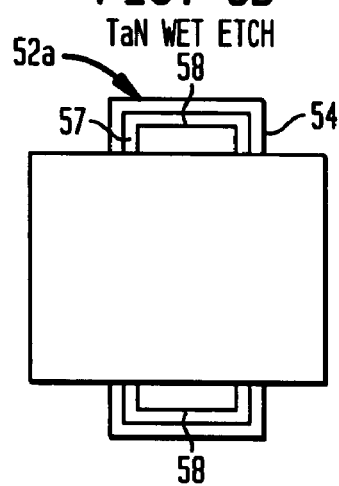
Figure 5C:
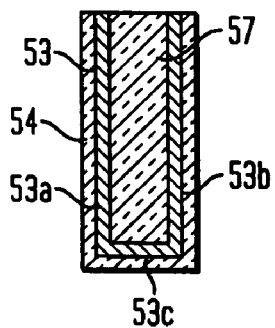
Figure 5D:
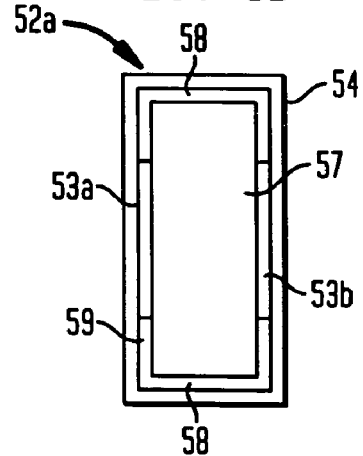

As mentioned, after the step of depositing a conductive material layer inside the trench that conforms to the structure of the formed collar at the bottom, front, back and sidewalls, it is necessary to remove the front and back portions. This is accomplished by an additional selective etch step now described in connection with FIGS. 5(a)-5(d). As shown in FIG. 5(a), there is depicted a top view of a trench 52a having a dielectric collar 54 (e.g., an oxide), a conforming buried thin conductive material layer 53 inside the trench that conforms to the structure of the trench having front, back and sidewall portion and a filled dielectric material 57. FIG. 5(a) additionally illustrates the placement of a wing mask 75 that is used in the selective etch process step to remove the front and back conductive material layer portions 53d, 53e. After placement of the wing mask 75, which is smaller enough than the trench width "w" so that the oxide filling the trench is exposed, RIE etch the oxide away so that the TaN is exposed all the way to the bottom of the trench. Then either a wet etch or a RIE etch could be used to remove the TaN from the exposed trench wall, leaving the TaN protected by the masked area. For the wet etch, an etchant selective to TaN (or PolySilicon) is applied to remove the front and back buried thin conductive layer portions 53d, 53e with the resulting structure showing the remaining gap 58 as shown in FIG. 5(b) and a cross-sectional view provided in FIG. 5(c). As known to skilled artisans a wet etch may be performed at this step using etchants such as $H_2:O:HF:HNO_3=4:1:5$. For the reactive ion etching (RIE), reactive gases such as $Cl_2$, $CF_4$, and $BCl_3$ with inductively coupled plasma could be used to remove TaN. A top view of the resultant trench structure 52a is illustrated in FIG. 5(d) showing the gap 58 left in a trench after the TaN (or PolySilicon) material wet etch and illustrating a potential TaN (or PolySilicon) film under cut region 59 due to the wet etch process step. In a final step, the remaining unfilled portion is filled with a dielectric material (e.g., oxide, nitride or oxynitride) and a CMP may be performed in a final step.

According to the second embodiment of the buried trench resistor 50, when either TaN or polySi thin film is buried in the trench (after implementing the wing mask/etch step), the approximate resistance value per trench, $R_{(Trench)}$, is calculated according to equation 2) as:

$$R_{(Trench)} = \rho(\text{TaN or polySi}) * (2h+w)/(tL) \qquad 2)$$

where "h" is the trench height, "w" is the trench width, "t" is the conductive film thickness, and "L" is the wing mask width. The rho (ρ) for TaN and polySi may be varied (e.g., for polySi, ρ may range between 3.0 ohm-μm-70 ohm-μm). Assuming a TaN ρ=3.0 ohm-μm and a trench height h=2.0 μm, trench width w=2.0 μm, TaN film thickness t=500 Å, and wing mask width L=1.0 μm, R(TaN) is approximately 600 ohm (ω). As shown in equation 2, the value of single resistor can be varied to suit the technology by varying ρ, L, w, h, and t.

Figure 4:
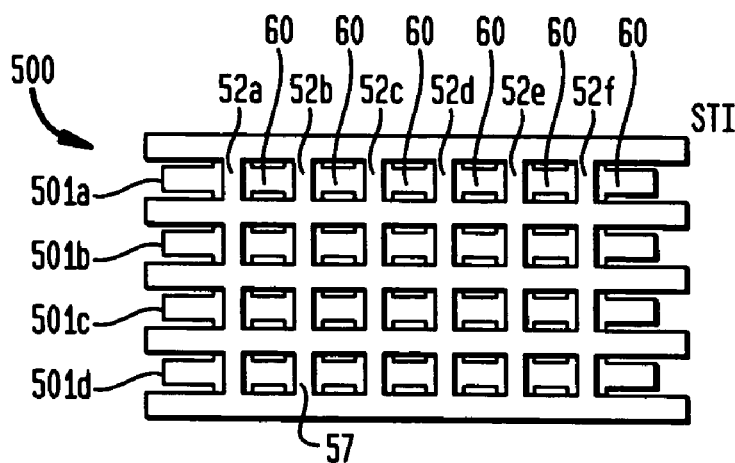
FIG. 4 illustrates a top view of a trench type buried resistor array having resistive elements formed in accordance with the embodiment depicted in FIG. 3.

FIG. 4 illustrates a top view of an example trench type buried resistor array 500 including resistors formed according to the embodiment depicted in FIG. 3. In the resistor array 500 of FIG. 4, multiple rows, e.g., four (4) rows 501a, . . . , 501d, each comprise a chain of resistor elements, e.g., six (6) trenches 52a-52g, are formed according to the method herein described. Selected top surface connections 60 may be connected to form the series connection of trench resistor elements so that the whole array comprises a chain connection of trench type resistive elements. Other configurations are possible with chains of buried trench resistor elements of the array connected in parallel. As will be described in greater detail herein, by connecting fuse devices at specific locations in the trench type buried resistor array of FIG. 4, or between connected trench type buried resistor arrays, and judiciously destroying one or more fuses, a resistor having a precise value may be programmed.

Figure 6:
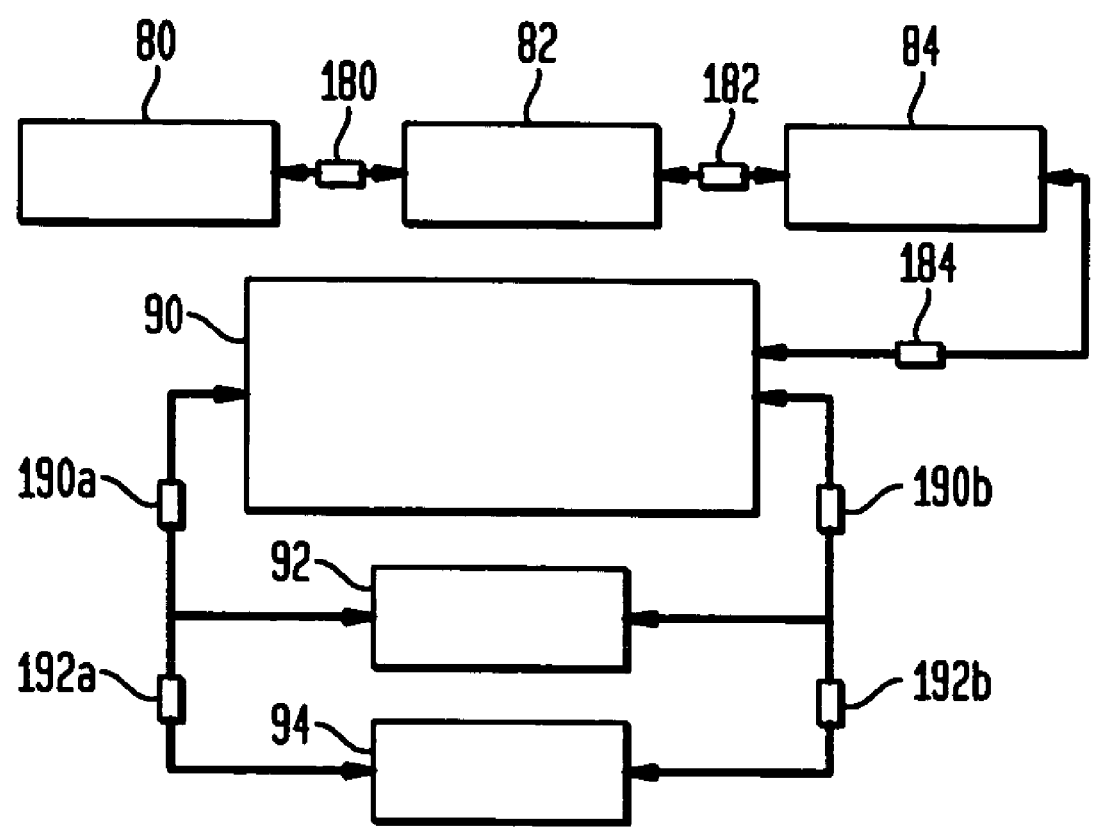

According to a further embodiment of the invention, both of the buried trench resistor arrays of FIGS. 2 and 4 may be connected in the form of a "trench resistor bank" to further improve the flexibility and precision of a semiconductor device. FIG. 6 illustrates a programmable trench resistor comprising sub-banks of buried trench type resistors according to the invention. As shown in FIG. 6, precision buried trench type resistors as shown in FIG. 1 or 3, or trench type precision resistor array such as shown in FIG. 2 or 4 form resistor sub-banks 80, 82 and 84 that may be connected in series through respective fuse devices 180, 182 and 184. Similarly, precision buried trench type resistors as shown in FIG. 1 or 3, or trench type precision resistor array such as shown in FIG. 2 or 4 form precision resistor sub-banks 90, 92 and 94 that may be connected in parallel. The parallel connection of precision resistor sub-banks 90, 92 and 94 are connected through respective fuse devices 190a,b and 192a,b as shown in FIG. 6. According to the invention, a total resistance of a formed resistor device may be programmed by implementing well-known techniques for blowing one or more fuse devices to add or subtract resistance, for example, by deleting serial connection of a trench resistor sub-bank (e.g., 80, 82, 84) or parallel connection of a trench resistor sub-bank (e.g., 92, 94).

Advantageously, utilizing a buried trench approach of the invention, the formed resistor device is ultra-compact and does not need a large amount of surface area. For example, a planar resistor with 1 F*1 F area has about 10× larger surface area than the trench resistor with surface area of 0.3 F*0.3 F and 1.5 F depth. By placing TaN material inside of the substrate, heat dissipation is significantly improved and no direct thermal impact of EM performance of top BEOL wires exists.

While there has been shown and described what is considered to be preferred embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that may fall within the scope of the appended claims.

Having thus described our invention, what we claim as new, and desire to secure by Letters Patent is:

1. A method for forming semiconductor resistor device comprising the steps of:
   a) forming a plurality of trenches in a semiconductor substrate, each trench separated with a dielectric region;
   c) forming a buried contact portion at a bottom of each trench;
   d) forming a collar of dielectric material above said buried contact portion in each trench;
   e) filling each trench with a conductive material to form a trench resistor element having said buried contact portion;
   f) forming a top surface connection of conductive material that conductively connects top surfaces of adjacent trench resistor elements in a first alternating configuration;
   g) ion implanting a connection band of doped semiconductor material conductively connecting bottom contact portions of two adjacent resistor elements in a second alternating configuration, whereby a chain of conductively connected trench resistor elements is formed that exhibits a precise resistor value.

2. The method of forming a semiconductor resistor device as claimed in claim 1, wherein at least two formed semiconductor resistor devices are connected in series or in parallel configuration through the intermediary of one or more fuse devices, said method including the step of blowing a fuse device to achieve a desired total resistance value.

* * * * *

UNITED STATES PATENT AND TRADEMARK OFFICE
CERTIFICATE OF CORRECTION

| | | |
|---|---|---|
| PATENT NO. | : 7,601,602 B2 | Page 1 of 1 |
| APPLICATION NO. | : 11/481514 | |
| DATED | : October 13, 2009 | |
| INVENTOR(S) | : Aitken et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 614 days.

Signed and Sealed this

Fifth Day of October, 2010

David J. Kappos
*Director of the United States Patent and Trademark Office*